(12) United States Patent
Takeo et al.

(10) Patent No.: US 8,837,087 B2
(45) Date of Patent: Sep. 16, 2014

(54) THIN MAGNETIC FILM, METHOD OF MANUFACTURING THE SAME, AND HIGH FREQUENCY OSCILLATOR, MAGNETIC HEAD, MAGNETIC RECORDING MEDIUM, AND MAGNETIC RECORDING/REPRODUCING APPARATUS USING THIN MAGNETIC FILM

(71) Applicants: Kabushiki Kaisha Toshiba, Tokyo (JP); Tohoku University, Sendai (JP); Showa Denko K.K., Tokyo (JP)

(72) Inventors: Akihiko Takeo, Kokubunji (JP); Akira Kikitsu, Yokohama (JP); Tomoyuki Maeda, Kawasaki (JP); Migaku Takahashi, Sendai (JP); Shin Saito, Sendai (JP); Ken Inoue, Ichihara (JP); Gohei Kurokawa, Ichihara (JP)

(73) Assignees: Kabushiki Kaisha Toshiba, Tokyo (JP); Tohoku University, Sendai-Shi (JP); Showa Denko K.K., Tokyo (JP)

( * ) Notice: Subject to any disclaimer, the term of this patent is extended or adjusted under 35 U.S.C. 154(b) by 0 days.

(21) Appl. No.: 13/946,938

(22) Filed: Jul. 19, 2013

(65) Prior Publication Data
US 2014/0139952 A1 May 22, 2014

(30) Foreign Application Priority Data
Nov. 16, 2012 (JP) ................................ 2012-252623

(51) Int. Cl.
*G11B 5/127* (2006.01)
(52) U.S. Cl.
USPC .................................... 360/125.3

(58) Field of Classification Search
USPC ........................................................ 360/125.3
See application file for complete search history.

(56) References Cited

U.S. PATENT DOCUMENTS

| | | | |
|---|---|---|---|
| 6,498,707 B1 * | 12/2002 | Gao et al. | 360/324.11 |
| 7,352,543 B2 * | 4/2008 | Li et al. | 360/324.2 |
| 7,355,823 B2 * | 4/2008 | Li et al. | 360/324.1 |
| 7,916,436 B2 * | 3/2011 | Ishizone et al. | 360/324.2 |
| 8,238,059 B1 * | 8/2012 | Tang et al. | 360/125.03 |
| 2001/0006436 A1 | 7/2001 | Akiyama et al. | |
| 2003/0104253 A1 | 6/2003 | Osawa et al. | |
| 2005/0219771 A1 | 10/2005 | Sato et al. | |
| 2006/0146452 A1 * | 7/2006 | Li et al. | 360/324.11 |
| 2009/0231755 A1 | 9/2009 | Takahashi et al. | |

FOREIGN PATENT DOCUMENTS

| | | |
|---|---|---|
| JP | 2001-189002 | 7/2001 |
| JP | 2003-132515 | 5/2003 |
| JP | 2006-351058 | 12/2006 |
| JP | 4050245 | 12/2007 |
| JP | 2012-059313 | 3/2012 |

\* cited by examiner

*Primary Examiner* — Mark Blouin
(74) *Attorney, Agent, or Firm* — Knobbe Martens Olson & Bear LLP

(57) ABSTRACT

According to one embodiment, there is provided a thin magnetic film having a negative anisotropy of $-6 \times 10^6$ erg/cm$^3$ or less and including, on at least a nonmagnetic substrate, at least one seed layer made of a metal or metal compound, a ruthenium underlayer for controlling the orientation of an immediately overlying layer, and a magnetic layer having negative anisotropy in the normal line direction perpendicular to a surface of the magnetic layer and mainly containing Co and Ir, wherein the additive element concentration of Ir in the magnetic layer is 10 (inclusive) to 45 (inclusive) at %.

14 Claims, 11 Drawing Sheets

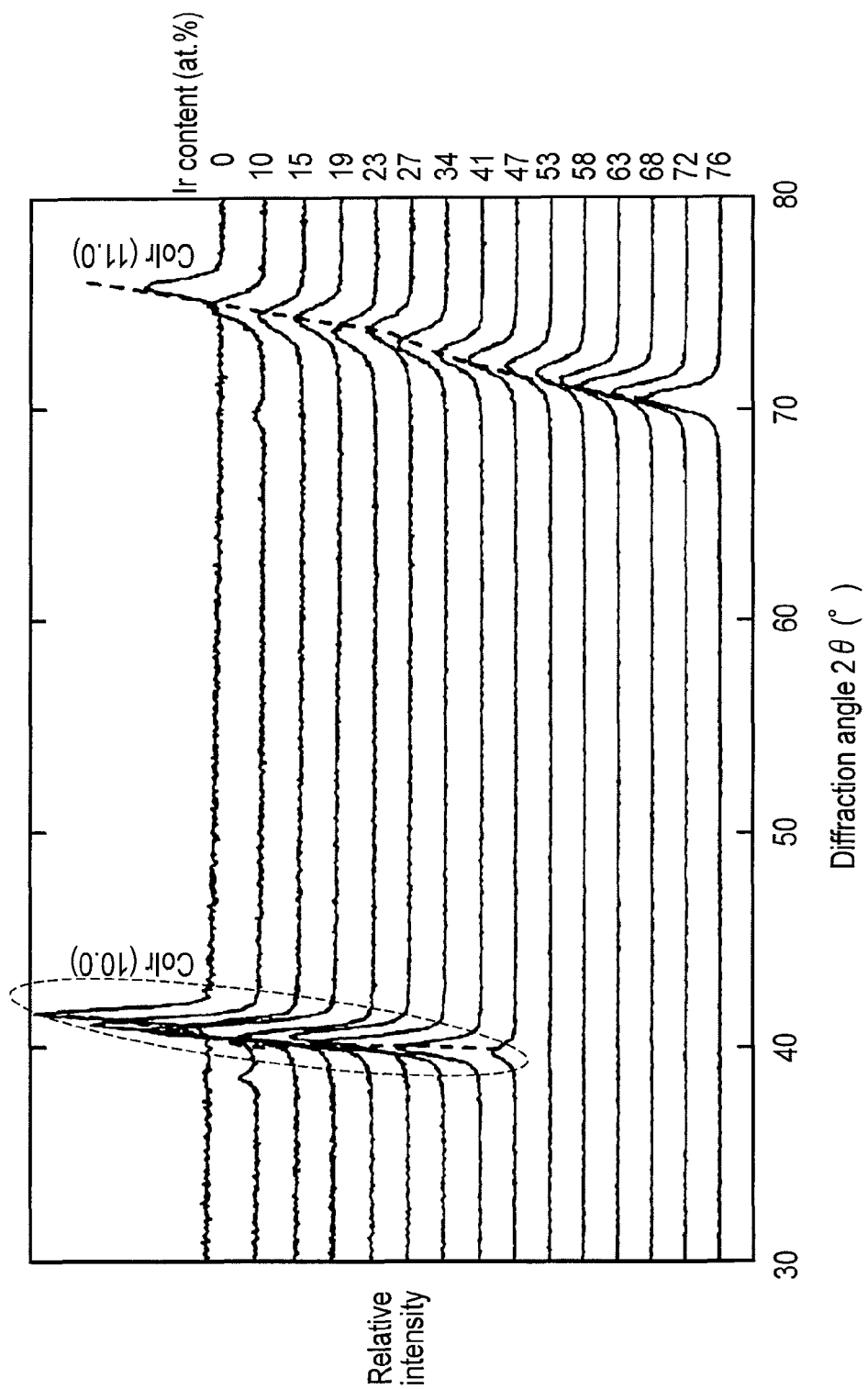
F I G. 3

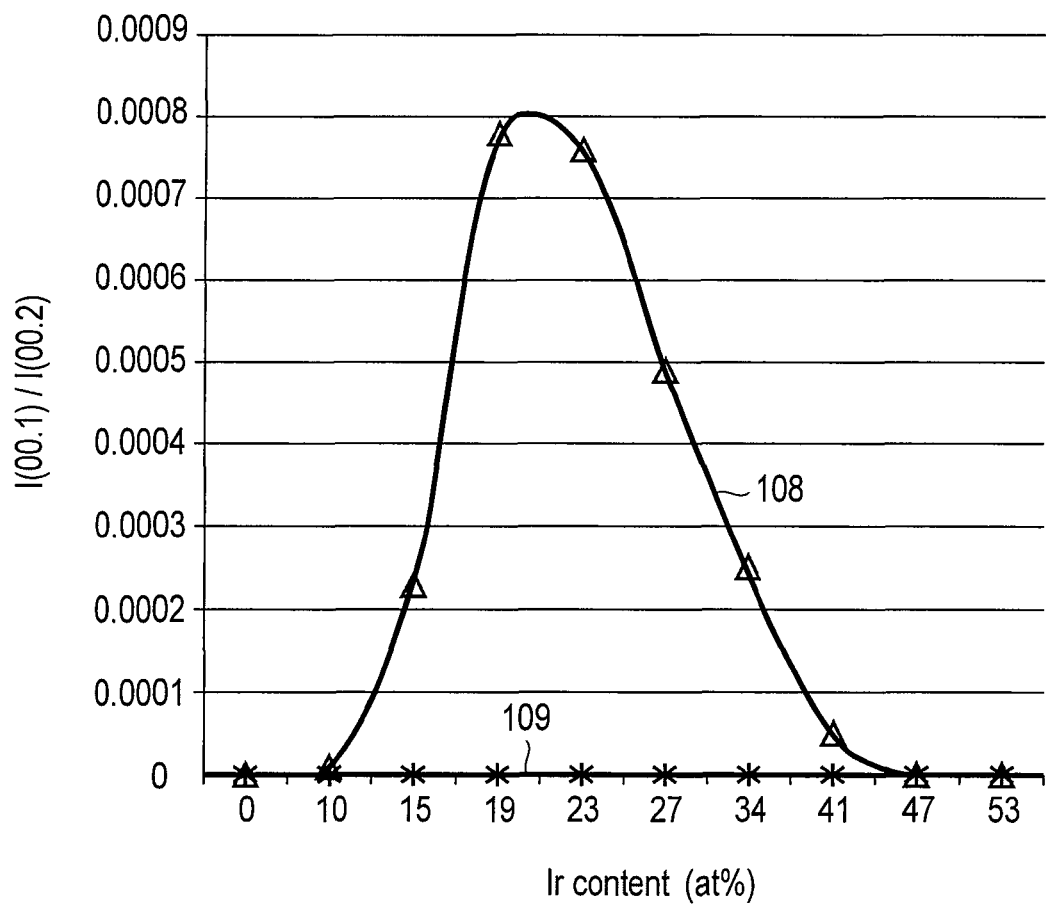
F I G. 5

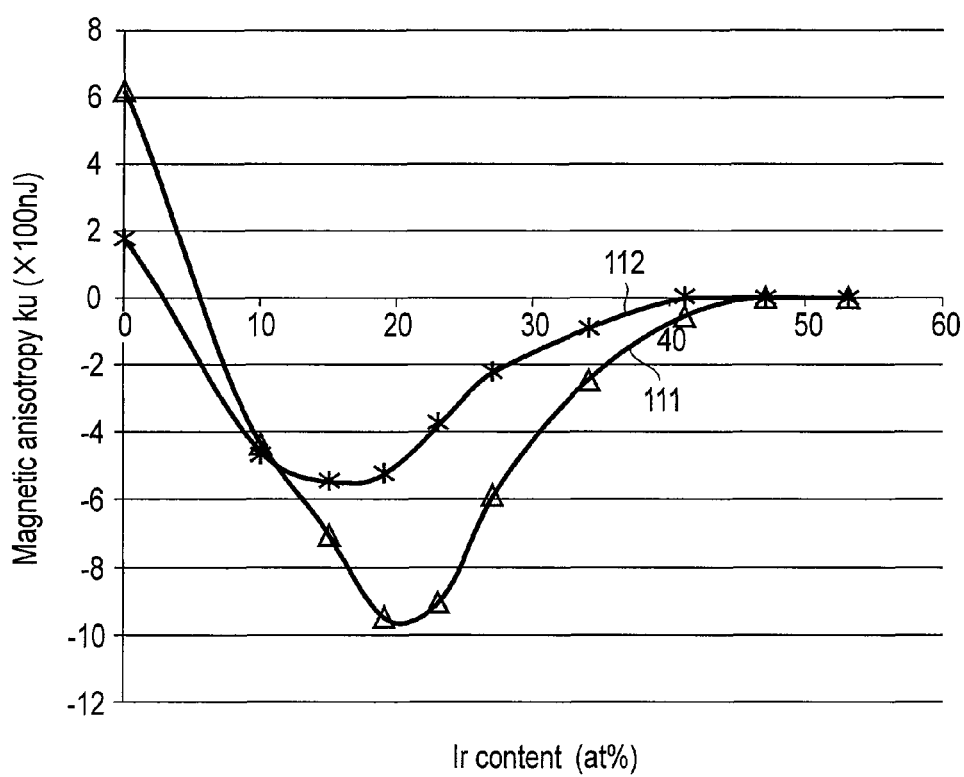
F I G. 6

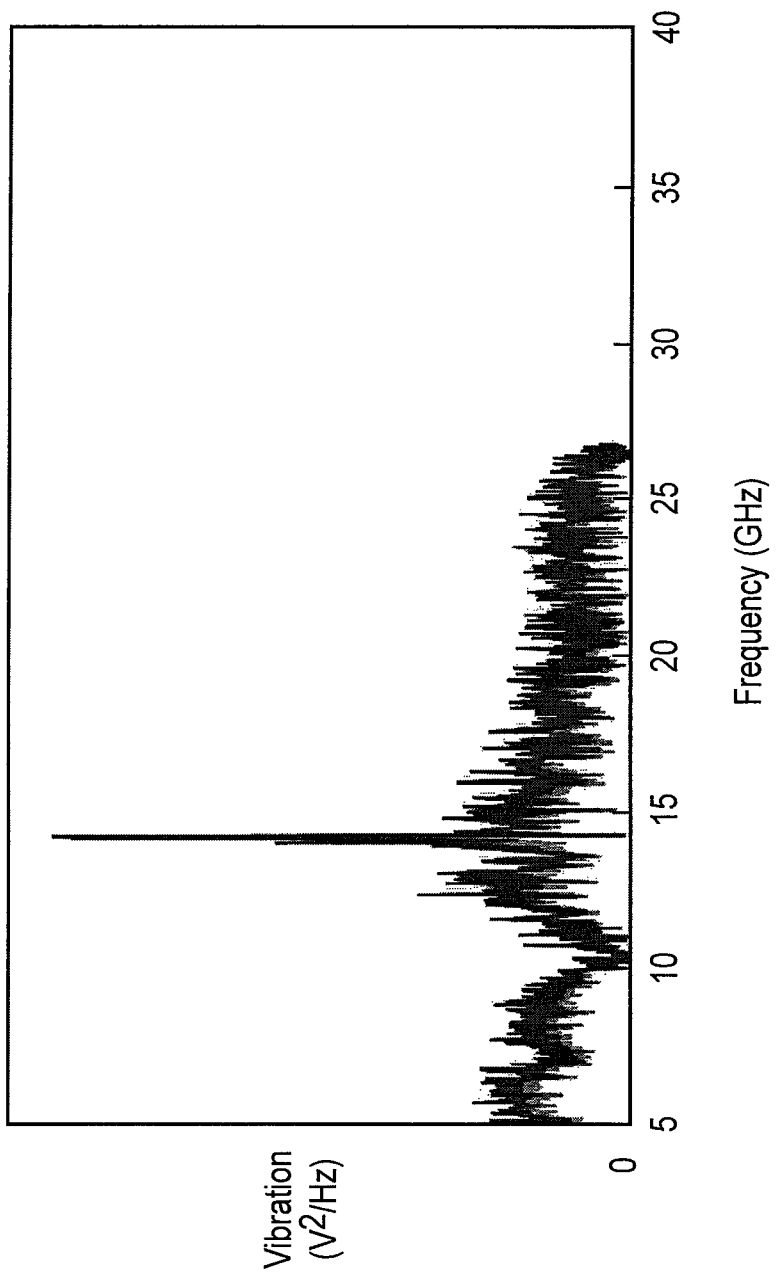
F I G. 8

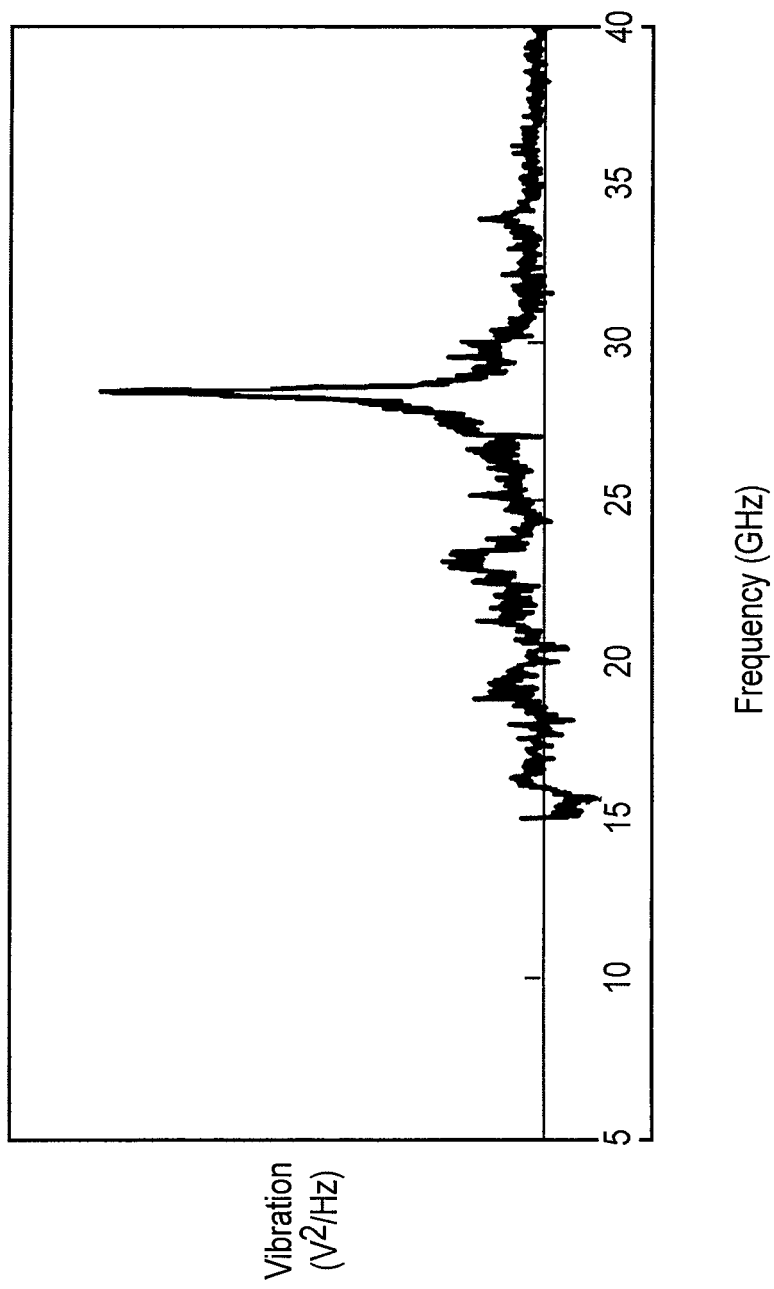
F I G. 9

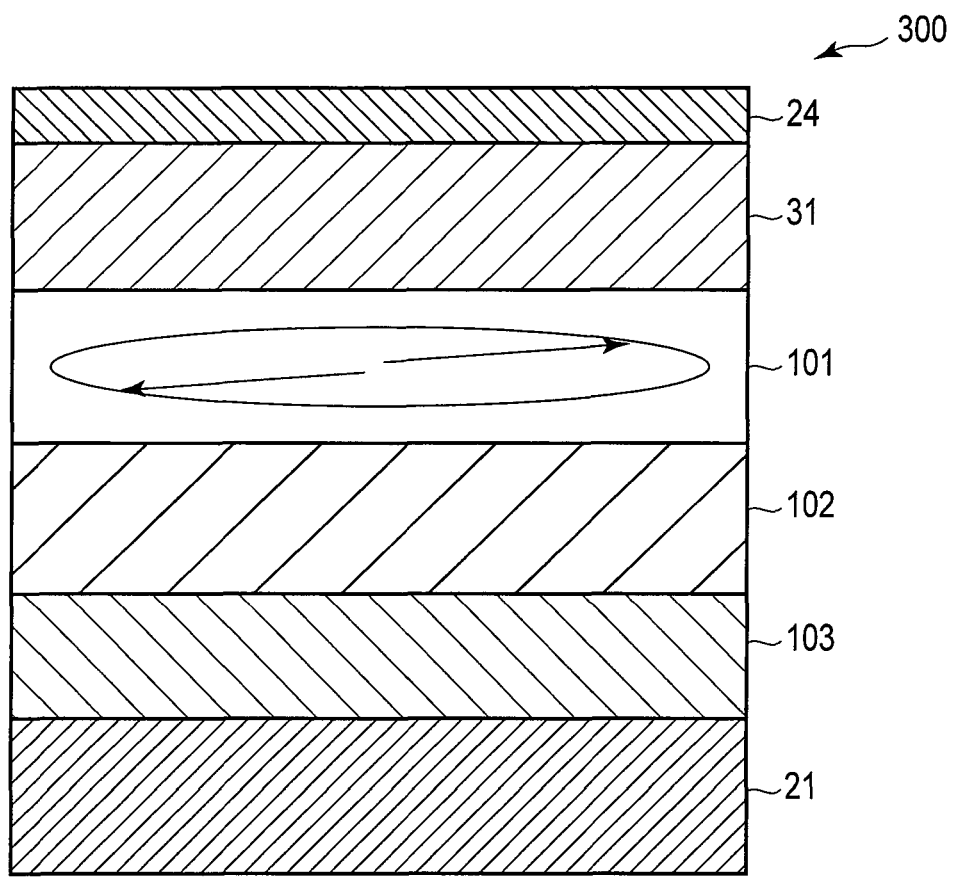
F I G. 12

THIN MAGNETIC FILM, METHOD OF MANUFACTURING THE SAME, AND HIGH FREQUENCY OSCILLATOR, MAGNETIC HEAD, MAGNETIC RECORDING MEDIUM, AND MAGNETIC RECORDING/REPRODUCING APPARATUS USING THIN MAGNETIC FILM

CROSS-REFERENCE TO RELATED APPLICATIONS

This application is based upon and claims the benefit of priority from Japanese Patent Application No. 2012-252623, filed Nov. 16, 2012, the entire contents of which are incorporated herein by reference.

FIELD

Embodiments described herein relate generally to a thin magnetic film, a method of manufacturing the same, and a high frequency oscillator, magnetic head, magnetic recording medium, and magnetic recording/reproducing apparatus using the thin magnetic film.

BACKGROUND

The recording density of a hard disk drive (HDD) as a kind of a magnetic recording/reproducing apparatus is presently increasing 50% or more per year, and this tendency presumably continues in the future. Accordingly, the development of a magnetic head and magnetic recording medium suitable for a high recording density is being made.

To increase the recording capacity of a presently commercially available magnetic recording/reproducing apparatus, the recording density of a magnetic recording medium is more and more increased. If the recording density is kept increased in the future, this may pose the problem of a thermal decay limit caused by downsizing of magnetic particles of a magnetic recording medium, and the problem of a high-density limit of the existing recording method caused by deterioration of the recording capability resulting from narrowed tracks of a magnetic head. As recording methods of breaking through this recording density limit, assisted recording methods such as thermally assisted recording and high frequency assisted recording are attracting attention.

The high frequency assisted recording method uses the ferromagnetic resonance of a thin magnetic film. That is, a recording head includes a high frequency oscillator called a spin torque oscillator, and a magnetic recording medium is irradiated with a high frequency magnetic field generated around this high frequency oscillator. If the high frequency magnetic field has a frequency band close to the magnetic resonance frequency of the magnetic recording medium, the medium magnetization resonates and readily reverses. Therefore, a recording magnetic pole is formed near the high frequency oscillator in the recording head. Consequently, even when a DC magnetic field applied from the recording magnetic pole to the medium is not so large compared to the medium coercive force, the recording magnetization direction of the medium magnetization can be matched with the recording magnetic pole direction. This facilitates information recording to the medium magnetization.

Several arrangements of the high frequency oscillator for use in this high frequency assisted recording have been proposed. For example, an oscillator using a magnetic layer having negative anisotropy as a magnetization oscillation layer has been proposed. In this oscillator, a spin injection layer having magnetic anisotropy perpendicular to the film surface and the magnetization oscillation layer having negative anisotropy are stacked with a nonmagnetic interlayer being sandwiched between them. In addition, electrodes for supplying an electric current in a direction perpendicular to the film surface of this multilayered magnetic film are formed at the two ends of the multilayered film. When an electric current is supplied to the oscillator formed by this multilayered magnetic film, electrons transmitted through or reflected by the spin injection layer are spin-polarized to one polarity in accordance with the polarity of magnetization in the spin injection layer, and flow into the magnetization oscillation layer having negative anisotropy through the nonmagnetic interlayer.

This polarized electron spin generates a spin torque force that rotates the magnetization of the magnetization oscillation layer in a predetermined direction. This spin torque force keeps rotating the magnetization oscillation layer in a predetermined direction in the film surface. Since the cycle of this rotation is generally a few GHz to a few ten GHz, a high frequency oscillator having a frequency band from a few GHz to a few ten GHz can be implemented.

The oscillation frequency of this oscillator is determined by, e.g., a damping constant $\alpha$ and magnetic anisotropy Ku of the thin magnetic film forming the magnetization oscillation layer, and the density of an electric current supplied to the oscillator. As the magnetic anisotropy of the magnetization oscillation layer increases in the negative direction, and as the current density increases, the oscillation frequency of the oscillator increases.

When designing a high frequency oscillator for use in high frequency assisted recording, the oscillation frequency must be brought near the magnetic resonance frequency of a magnetic recording medium. Generally, the magnetic resonance frequency of a magnetic recording medium having a high positive anisotropic magnetic field of Hk=15 kOe or more is 20 GHz or more. Therefore, the oscillation frequency of the high frequency oscillator must also be set at 20 GHz or more. However, in a conventional magnetic material having a large negative anisotropy, the anisotropy is at most about Ku=−4× $10^6$ erg/cc (−4×$10^8$ nJ/cc), and this negative anisotropy is too weak to apply the material to the high frequency oscillator as described above.

The method of raising the oscillation frequency of the high frequency oscillator as described previously can also be implemented by raising the density of an electric current to be supplied to the oscillator, instead of increasing the negative anisotropy of the material. Since, however, the oscillator is mainly formed by the multilayered thin magnetic film, the oscillator melts due to heat if the current density is raised too much. This makes it difficult to realize a current density equal to or lower than a predetermined limit. Under the circumstances, it is desirable to form a thin magnetic film having a stronger negative anisotropy in order to implement a high frequency oscillator for use in high frequency assisted recording.

BRIEF DESCRIPTION OF THE DRAWINGS

FIG. 3 is an X-ray diffraction graph obtained by measuring the thin magnetic film by in-plane measurement;

FIG. 5 shows the peak intensity ratio of a (00.1) diffraction line to a (00.2) diffraction line;

FIG. 6 is a graph showing the relationship between the composition and magnetic anisotropy of a magnetic layer of the thin magnetic film;

FIG. 8 is a graph showing the oscillation frequency spectrum of a spin torque oscillator according to Comparative Example 3;

FIG. 9 is a graph showing the oscillation frequency spectrum of the spin torque oscillator according to Example 3;

FIG. 12 is a schematic view showing an example of the arrangement of a magnetic recording medium according to the sixth embodiment.

DETAILED DESCRIPTION

Figure 1:
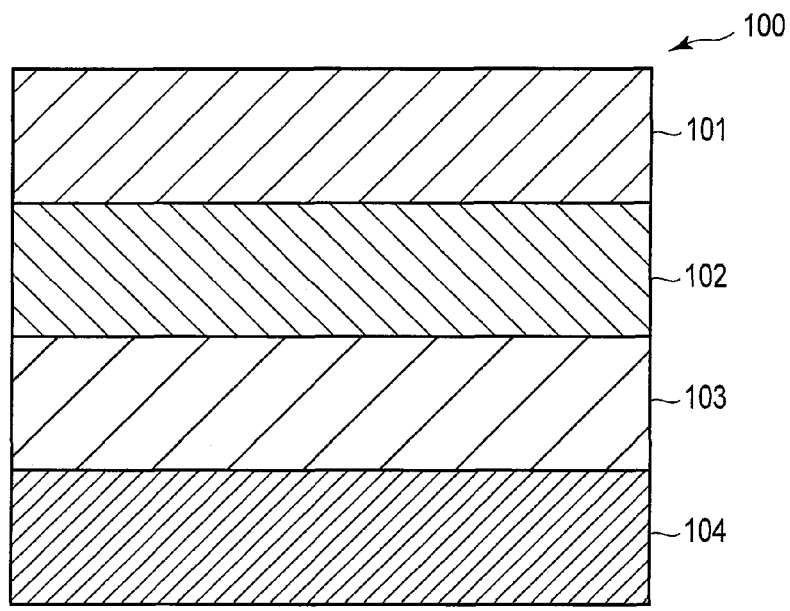
FIG. 1 is a schematic sectional view showing the arrangement of an example of a thin magnetic film according to the first embodiment.

A thin magnetic film according to the first embodiment includes a nonmagnetic substrate, a underlayer formed on the nonmagnetic substrate, and a magnetic layer formed in contact with the underlayer.

The underlayer used in the first embodiment is practically made of ruthenium. The magnetic layer used in the first embodiment has a negative anisotropy of $-6 \times 10^6$ to $-1.2 \times 10^7$ erg/cm$^3$ ($-6 \times 10^8$ to $-1.2 \times 10^9$ nJ/cm$^3$) in the normal line direction perpendicular to the film surface, and contains $Co_{1-x}Ir_x$ (x=10 to 45 at %) as a main component.

Note that the main component of the magnetic layer herein mentioned is a component practically forming the magnetic layer, and the magnetic layer can contain an impurity in addition to the main component as long as the impurity has no influence on the physical properties.

In the first embodiment, a thin magnetic film having a strong negative anisotropy of $-6 \times 10^6$ to $-1.2 \times 10^7$ erg/cm$^3$ ($-6 \times 10^8$ to $-1.2 \times 10^9$ nJ/cm$^3$) in the normal line direction perpendicular to the film surface can be obtained by using the ruthenium underlayer, and the magnetic layer directly formed on the ruthenium underlayer and mainly containing $Co_{1-x}Ir_x$ (x=10 to 45 at %).

In a thin magnetic film manufacturing method according to the second embodiment, it is possible to obtain a thin magnetic film manufacturing method including a step of forming an underlayer on a nonmagnetic substrate, and a step of forming a magnetic layer on the underlayer.

The underlayer used in the second embodiment is practically made of ruthenium. Also, annealing is performed on the underlayer at a temperature of 400° C. (inclusive) to 650° C. (exclusive). Furthermore, the magnetic layer is formed in contact with the annealed ruthenium underlayer, and mainly contains $Co_{1-x}Ir_x$ (x=10 to 45 at %).

In the second embodiment, a thin magnetic film having a strong negative anisotropy in the normal line direction perpendicular to the film surface is obtained by annealing the ruthenium underlayer at a temperature of 400° C. (inclusive) to 650° C. (exclusive), and forming the magnetic layer mainly containing $Co_{1-x}Ir_x$ (x=10 to 45 at %) in contact with the ruthenium underlayer.

The third embodiment is an application example of the thin magnetic film according to the first embodiment, and includes a first magnetic layer formed by a thin magnetic film using a first electrode as a nonmagnetic substrate, a nonmagnetic interlayer formed on the first magnetic layer, a second magnetic layer formed on the nonmagnetic interlayer, and a second electrode formed on the second magnetic layer.

The first magnetic layer used in the third embodiment includes the first electrode, a ruthenium underlayer formed on the first electrode, and a magnetic layer formed in contact with the ruthenium underlayer, having a negative anisotropy of $-6 \times 10^6$ to $-1.2 \times 10^7$ erg/cm$^3$ ($-6 \times 10^8$ to $-1.2 \times 10^9$ nJ/cm$^3$) in the normal line direction perpendicular to the film surface, and mainly containing $Co_{1-x}Ir_x$ (x=10 to 45 at %).

The second magnetic layer is formed on the nonmagnetic interlayer, has perpendicular magnetic anisotropy, and contains at least one type of a magnetic material selected from the group consisting of iron, cobalt, and nickel.

In the third embodiment, an electric current is supplied to the first and second magnetic layers in the direction perpendicular to the film surfaces by applying a voltage to the first and second electrodes. Consequently, a high frequency oscillator in which the first magnetic layer oscillates at a high frequency due to the spin torque of electrons flowing from the second magnetic layer to the first magnetic layer is obtained.

A magnetic head according to the fourth embodiment includes a main magnetic pole, a recording magnetic pole that forms a magnetic circuit together with the main magnetic pole, and the above-described high frequency oscillator formed between the main magnetic pole and recording magnetic pole.

A magnetic recording/reproducing apparatus according to the fifth embodiment includes a magnetic head including a main magnetic pole, a recording magnetic pole that forms a magnetic circuit together with the main magnetic pole, and the above-described high frequency oscillator formed between the main magnetic pole and recording magnetic pole.

In the fourth and fifth embodiments, a high frequency oscillator that oscillates at a high frequency of 20 GHz or more is obtained by using the thin magnetic film having a strong negative anisotropy in the normal line direction perpendicular to the film surface, and a high frequency oscillator and magnetic head suited to high frequency assisted recording are obtained because the oscillation frequency can be brought near the magnetic resonance frequency of a magnetic recording medium.

The fourth and fifth embodiments have the advantage that the realization of high frequency assisted recording makes it possible to implement a magnetic recording/reproducing apparatus having an information recording density higher than those of the conventional magnetic recording apparatuses.

A perpendicular magnetic recording medium accordingly to the sixth embodiment includes a nonmagnetic substrate, a ruthenium underlayer formed on the nonmagnetic substrate, a soft magnetic backing layer formed in contact with the ruthenium underlayer, and a perpendicular magnetic recording layer formed on the soft magnetic backing layer.

The soft magnetic backing layer has a negative anisotropy of $-6 \times 10^6$ to $-1.2 \times 10^7$ erg/cm$^3$ ($-6 \times 10^8$ to $-1.2 \times 10^9$ nJ/cm$^3$) in the normal line direction perpendicular to the film surface, and mainly contains $Co_{1-x}Ir_x$ (x=10 to 45 at %).

The perpendicular magnetic recording layer contains cobalt, chromium, and platinum.

A magnetic recording/reproducing apparatus according to the seventh embodiment includes the above-mentioned perpendicular magnetic recording medium and magnetic head.

As indicated by the sixth and seventh embodiments, the magnetic layer having a strong negative anisotropy used in the embodiments can also function as a part of a magnetic recording medium. A perpendicular magnetic recording medium used in a present magnetic recording apparatus such as a hard disk drive (HDD) can include a soft magnetic backing layer (SUL) formed by a thin soft magnetic film, a seed layer and ruthenium underlayer for improving the alignment of a magnetic recording layer, a perpendicular magnetic recording layer, and a protective layer. The soft magnetic backing layer (SUL) is used to form a magnetic path together with a magnetic head. Therefore, when the SUL is formed as close as possible to the magnetic recording layer, it is possible to strengthen the magnetic coupling between the SUL and a magnetic head running on the perpendicular recording medium. However, a thin soft magnetic film used in a general SUL is made of an amorphous material containing, e.g., Fe, Co, or Ni. Accordingly, to improve the alignment of magnetic particles in the perpendicular magnetic recording layer, a 10- to 20-nm thick ruthenium underlayer for forming the same hexagonal close-packed lattice as that of the magnetic recording layer must be formed immediately below it.

The thin-magnetic-film magnetic layer having negative magnetic anisotropy obtained by the first embodiment can also be used as a substitute material for the soft magnetic backing layer of the perpendicular magnetic recording medium. Furthermore, when using a magnetic layer mainly containing CoIr as the magnetic layer having negative magnetic anisotropy, the crystal structure of the magnetic layer is a hexagonal close-packed lattice very close to a CoPtCr alloy used in a general perpendicular magnetic recording layer. This makes it possible to eliminate or exceedingly thin the ruthenium underlayer between the substitute under layer having negative anisotropy and the perpendicular magnetic recording layer. Consequently, a substitute under layer having a stronger coupling with a magnetic head can be provided.

In the sixth and seventh embodiments, the substitute under layer and magnetic recording layer can be formed in direct contact with each other. Alternatively, a ruthenium underlayer having a thickness of 0 nm (exclusive) to 5 nm (inclusive) can be formed between the soft magnetic backing layer and magnetic recording layer.

The nonmagnetic substrate can be selected from smooth substrates such as a glass substrate, Si substrate, and Al substrate.

In the embodiments, a seed layer containing at least one of Ta, Pt, Ti, and Ni can further be formed between the nonmagnetic substrate and Ru underlayer of the thin magnetic film.

This seed layer can be a stack of, e.g., a Ta layer and Pt layer.

As the seed layer, it is possible to use a material that does not impede the hcp orientation of the Ru underlayer. An example of the seed layer is one or more layers of a metal or metal compound selected from Ti, Ni, or an alloy of Ti or Ni.

The formation of the seed layer has the advantages that the crystal orientation of Ru particles in the Ru underlayer above the seed layer becomes more homogeneous, and the homogeneity of the magnetic layer above the Ru underlayer improves.

As the nonmagnetic interlayer, a 0.3- to 0.5-nm thick nonmagnetic metal conductive film can be used. Examples of the material of the nonmagnetic interlayer are Cu, Au, Ag, Pt, and Pd. If the thickness of the nonmagnetic interlayer is less than 0.3 nm, metal particles forming the interlayer cannot form any layered structure because the thickness is too small, so stable characteristics as an electrical conductor cannot be obtained. If the thickness of the nonmagnetic interlayer exceeds 5 nm, the spin polarization effect of a spin electric current polarized when transmitted through or reflected by the magnetic layer decreases.

As the first and second electrodes, it is possible to use, e.g., Cu, Au, Ag, or Ta. The first and second electrodes can be made of the same material or different materials.

The embodiments will be explained in more detail below with reference to the accompanying drawings.

FIG. 1 is a schematic sectional view showing the arrangement of an example of the thin magnetic film according to the first embodiment.

As shown in FIG. 1, a thin magnetic film 100 includes a nonmagnetic substrate 104 made of glass or the like, and a seed layer 103, underlayer 102, and 20-nm thick CoIr alloy 101 stacked in this order on the nonmagnetic substrate 104. The seed layer 103 is obtained by stacking, e.g., a 5- to 10-nm thick Ta layer and 5- to 10-nm thick Pt layer. The underlayer 102 is, e.g., a 10- to 20-nm thick Ru layer.

In the manufacture of the thin magnetic film 100, the CoIr-based alloy 101 can be formed after the whole substrate is heated at a temperature Tc, e.g., 400° C. (inclusive) to 650° C. after the Ru layer is formed.

EXAMPLES

Example 1

First, a 5-nm thick Ta layer and 6-nm thick Pt layer were stacked as a seed layer by sputtering on a nonmagnetic substrate 104 made of, e.g., doughnut-like disk glass having a thickness of 0.800 mm and a diameter of 63.5 mm, and a 20-nm thick Ru layer was deposited on the Pt layer by sputtering.

After the Ru layer was deposited, the whole substrate was heated at a temperature Tc for 5 min, thereby performing annealing. After that, the substrate was cooled until the substrate temperature became equal to room temperature, and a 20-nm thick alloy containing 80 at % of Co and 20 at % of Ir was deposited on the Ru layer by sputtering, thereby obtaining a thin magnetic film having the same arrangement as that shown in FIG. 1.

In this process, the temperature Tc was changed to room temperature, 300° C., 400° C., 500° C., 600° C., and 650° C. The saturation magnetization and magnetic anisotropy of each of the obtained thin magnetic films were measured. That is, the saturation magnetization of each thin film sample was measured using a VSM (Vibrating Sample Magnetometer), and the magnetic anisotropy (Ku) of each sample was measured using a magnetic torque meter. The saturation magnetization was 900 emu/cm$^3$ (900×10$^3$ A/m).

Figure 2:
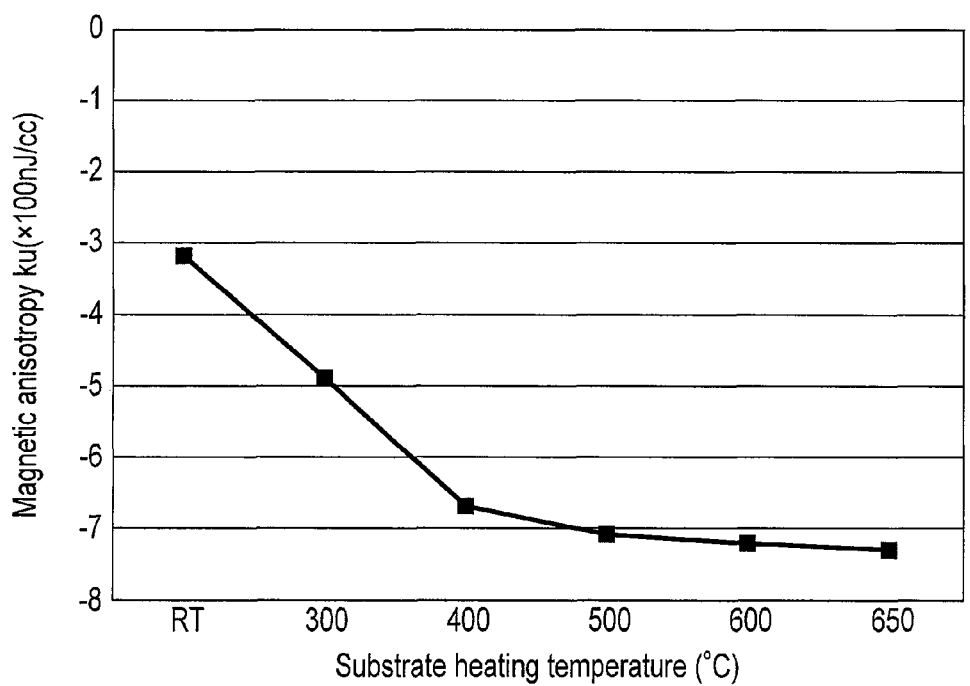
FIG. 2 is a graph showing the dependence of the magnetic anisotropy of the thin magnetic film on the substrate heating temperature.

FIG. 2 is a graph showing the dependence of the magnetic anisotropy on the substrate heating temperature.

As shown in FIG. 2, when the substrate heating temperature was increased to 400° C. or more after the Ru film was deposited, the negative magnetic anisotropy further increased, and it was possible to obtain a characteristic of about −7×10$^6$ erg/cm$^3$ (−7×10$^8$ nJ/cm$^3$). Thus, the magnetic anisotropy increased in the negative direction by heating the substrate after the deposition of Ru and before the deposition of CoIr. The same tendency was observed when the Ta thickness of the seed layer was 3 to 10 nm, the Pt thickness of the seed layer was 3 to 10 nm, and the Ru thickness of the underlayer was 6 to 30 nm. Note that for convenience, experiments were conducted up to a heating temperature of 650° C., but no further heating could be performed due to the restrictions on the experimental installation.

Comparative Example 1

Following the same procedure as in Example 1, a 5-nm thick Ta layer, 10-nm thick Pt layer, 20-nm thick Ru layer, and 20-nm thick alloy layer containing 80 at % of Co and 20 at % of Ir were stacked on a nonmagnetic substrate by sputtering. No heating was performed after the Ru layer was deposited. The magnetic characteristics of the obtained magnetic recording medium were evaluated.

In Comparative Example 1, the saturation magnetization (Ms) was 900 emu/cm$^3$, and the magnetic anisotropy was $-4 \times 10^6$ erg/cm$^3$ ($-4 \times 10^8$ nJ/cm$^3$).

The degree to which the negative anisotropy of the thin magnetic film can be increased perhaps depends on the degree of regularity of the crystallinity of the CoIr alloy.

Example 2

As Example 2, a glass substrate identical to that of Example 1 was prepared, and a 10-nm thick Ta layer and 10-nm thick Pt layer as a seed layer and a 20-nm thick Ru layer as a underlayer were deposited by sputtering. After the Ru layer was deposited, annealing was performed for 5 min by increasing the substrate temperature to 600° C. Thin magnetic films were formed following the same procedure as in Example 1 except that 20-nm thick CoIr films were deposited by sputtering by changing the Ir composition ratio in CoIr before the deposition to 0, 10, 15, 19, 23, 27, 34, 41, 47, 53, 58, 63, 68, 72, and 76 at %.

X-ray diffraction measurement was performed on each of the obtained thin magnetic films in order to evaluate the crystal structure of the thin CoIr film.

The crystal structure of the thin film was analyzed by using an X-ray diffraction graph obtained by in-plane measurement and an X-ray diffraction graph obtained by out-of-plane measurement.

"In-plane measurement" is to perform measurement by fixing the X-ray incidence angle with respect to the thin film sample to a small angle close to the total reflection critical angle (0.2° to 0.5°), and is a method of evaluating a lattice plane perpendicular to the surface of the thin film sample. "Out-of-plane measurement" is a method of scanning incident X-rays and a detector at an angle of 5° to 90° with respect to the thin film sample, and evaluating a lattice plane parallel to the thin film sample by X-ray diffraction.

Figure 4:
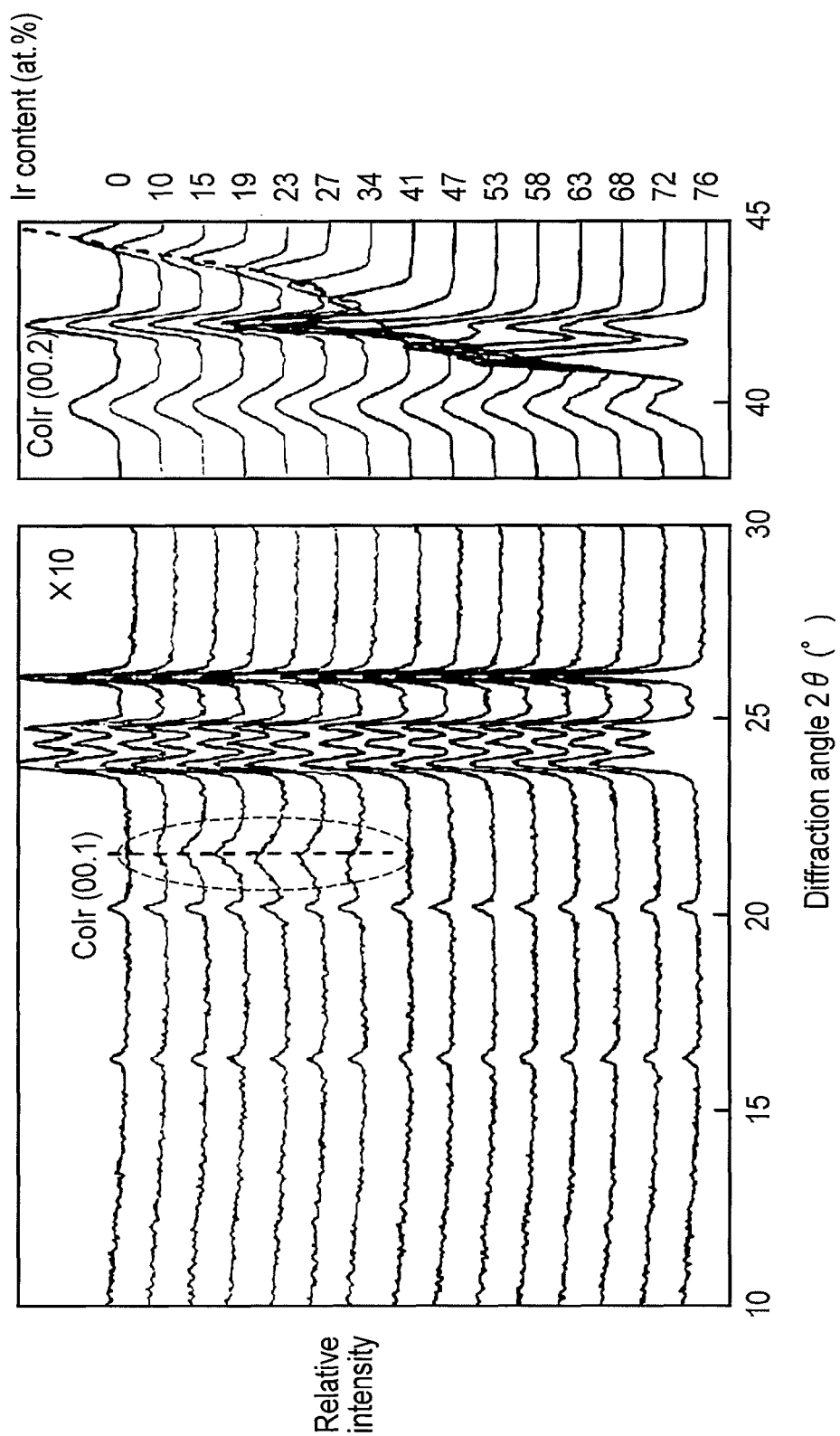
FIG. 4 is an X-ray diffraction graph obtained by measuring the thin magnetic film by out-of-plane measurement.

FIGS. 3 and 4 respectively show X-ray diffraction graphs of in-plane measurement and out-of-plane measurement performed for the formed thin magnetic films. Referring to FIG. 3, the diffraction peaks of CoIr(10.0) were observed until the Ir addition amount was up to about 40 at %. Referring to FIG. 4, the diffraction lines of CoIr(00.1) and CoIr(00.2) appeared when the Ir addition amount was 10 to 34 at %.

Comparative Example 2

As Comparative Example 2, thin magnetic films were formed following the same procedure as in Example 2 except that a substrate was not heated after an Ru layer was deposited.

The diffraction peak intensity of each of these films was not clearly observed in Comparative Example 2 in which no substrate heating was performed after deposition. FIG. 5 shows a graph plotting the peak intensity ratio of a (00.1) diffraction line to a (00.2) diffraction line for each Ir composition in Example 2 and Comparative Example 2. In FIG. 5, reference numeral 108 denotes Example 2, and reference numeral 109 denotes Comparative Example 2.

In Comparative Example 2, no (00.1) diffraction line peak appeared regardless of the Ir composition. In Example 2 in which substrate heating was performed after deposition, however, a (00.1) regular line was observed when the Ir composition ranged from 10% to 45%.

The magnetic anisotropy was also measured in Comparative Example 2 and Example 2.

FIG. 6 shows a graph representing the relationship between the magnetic anisotropy and the composition of the magnetic layer of the thin magnetic film.

When compared to Comparative Example 2 indicated by a line 112, a strong negative magnetic anisotropy was found when the Ir addition amount was 10% to 45% in Example 2 indicated by a line 111. This demonstrates that the negative magnetic anisotropy increased within the range in which the diffraction regular line shown in FIG. 5 appeared. That is, a regular phase was formed in the thin CoIr film formed by substrate heating before CoIr deposition, and this regular phase increased the negative magnetic anisotropy of the thin CoIr film. Consequently, it was possible to achieve a previously unreported strong magnetic anisotropy exceeding $-8 \times 10^6$ erg/cm$^3$ ($-8 \times 10^8$ nJ/cm$^3$) when the Ir composition ratio was about 20%.

Example 3

Application examples using a thin magnetic film having a strong negative magnetic anisotropy will be explained below. First, an application example in which the thin magnetic film having a strong negative magnetic anisotropy is used as an oscillation layer of a spin torque oscillator will be described as an example of the third embodiment.

Figure 7:
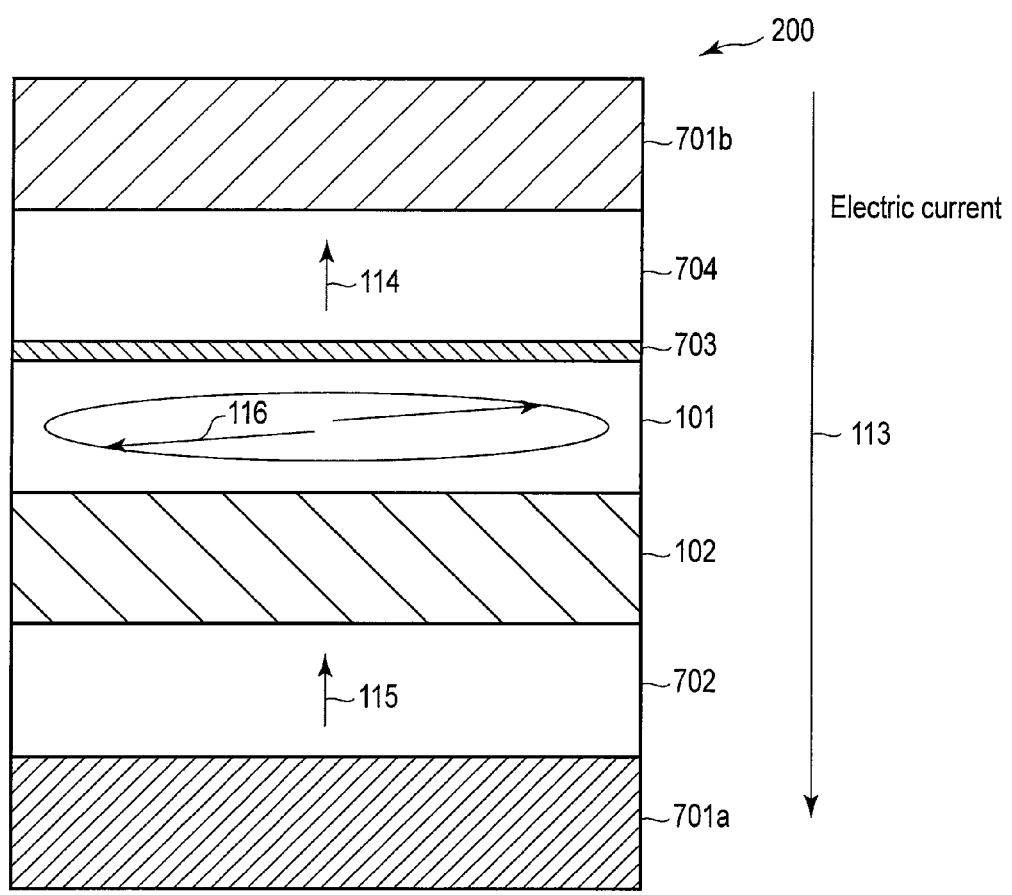
FIG. 7 is a schematic view showing the basic arrangement of a spin torque oscillator according to the third embodiment.

FIG. 7 is a schematic view showing the basic arrangement of the spin torque oscillator according to the third embodiment.

A spin torque oscillator 200 has a multilayered structure in which a perpendicular magnetization film 702 for applying a magnetic field to an oscillation layer, an Ru underlayer 102, a first magnetic layer 101 formed by a thin CoIr film and having negative anisotropy, an interlayer 703 formed by a thin metal conductor film, and a second magnetic layer 704 as a spin injection layer formed by a perpendicular magnetization film having perpendicular anisotropy are stacked in this order between first and second electrodes 701a and 701b. Arrows 114, 115, and 116 indicate the directions of magnetization in the magnetic layers.

This is a spin torque oscillator that oscillates the magnetization of the CoIr layer 101 when an electric current is supplied between the two electrodes 701a and 701b. It is also possible to omit the perpendicular magnetization film 702, and apply a magnetic field to the oscillation layer 101 by using an externally applied magnetic field instead.

To manufacture the spin torque oscillator 200, a Cu electrode 701a formed by plating on an AlO$_x$ substrate was first prepared, and then a 20-nm thick CoPt perpendicular magnetization film and 20-nm thick Ru underlayer were stacked on the Cu electrode 701a. After the Ru underlayer was deposited, substrate heating was performed at 600° C. for 5 min. After that, the substrate temperature was decreased to room temperature, and a 10-nm thick Co80% Ir20% film, 3-nm thick Cu as an interlayer, an artificial lattice film obtained as a spin injection layer by stacking eight two-layered films each including a 0.4-nm thick Co film and 0.8-nm thick Pt film, and 3-nm thick Pd as an uppermost protective layer were deposited by sputtering, thereby obtaining a multilayered element. This multilayered element was processed into a square having dimensions of 60 nm×60 nm by mask milling, and an $SiO_2$ insulating film was buried around the element. After that, a Cu electrode 702b was formed on top of the element by plating.

As the perpendicular magnetization film 702, a thin magnetic film having a strong saturation magnetization and strong positive magnetic anisotropy can be used. For example, it is possible to use thin magnetic films such as CoPt, a multilayered film including a Co film and Pt film, a multilayered film including a Co alloy film and Fe alloy film, CoCrPt, and SmCo.

Also, as the spin injection layer 704 as the second magnetic layer, a perpendicular magnetization film that generates strong spin polarization in the interface between the spin injection layer 704 and interlayer 703. As the spin injection layer, it is possible to use the same material as that of the perpendicular magnetization film 702, e.g., thin magnetic films such as CoPt, a multilayered film including a Co film and Pt film, a multilayered film including a Co alloy film and Fe alloy film, CoCrPt, and SmCo. However, the efficiency of the spin torque effect obtained by an electric current is generally high for an extremely small size. Therefore, the element dimensions can be 5 nm×5 nm to 100 nm×100 nm, and the total film thickness except for the electrodes can be 10 to 100 nm. If the element dimensions are less than 5 nm×5 nm, the total volume of the oscillation layer 101 is too small, so no sufficient oscillation microwave can be generated. If the element dimensions exceed 100 nm×100 nm, the magnetization of the oscillation layer 101 cannot uniformly oscillate, so no sufficient oscillation characteristic can be obtained. Also, if the total film thickness except for the electrodes is less than 10 nm, the total volume of the oscillation layer 101 is too small, so no sufficient oscillation microwave can be generated. If the total film thickness exceeds 100 nm, the shape aspect ratio (the ratio of the film thickness to the element width) of the oscillator becomes 1 or more, and this makes element processing difficult or makes oscillation unstable.

Comparative Example 3

As Comparative Example 3, an oscillator was formed without performing any substrate heating at 600° C. after the deposition of Ru as 102 and before the deposition of CoIr as 101.

When a voltage was applied to this spin torque oscillator in the direction perpendicular to the film surfaces, an electric current flows through the layers as indicated by an arrow 113. When the spin injection layer 704 is uniformly magnetized, the spin polarizing effect causes electrons transmitted through the injection layer to form an electron flow polarized in the same direction as that of the magnetization spin, and causes electrons reflected by the injection layer to form an electron flow polarized in the direction opposite to that of the magnetization spin.

When an electric current spin-polarized in one direction is supplied to the oscillation layer through the spin injection layer, a spin torque force that aligns the magnetization in the oscillation layer with the spin moment in the same direction as that of the polarized electrons is generated. When the intensity of the magnetic field applied from the perpendicular magnetization film 702 is balanced with this spin torque force in opposite directions, the magnetization in the oscillation layer does not converge but continues precession. This is the state in which the spin torque oscillator is oscillating. This oscillation frequency is the magnetization precession frequency, and changes in accordance with the strength of the negative anisotropy of the oscillation layer.

The element resistance of the formed spin torque oscillator was about 20Ω. The spectrum of the oscillation frequency of this spin torque oscillator was measured by applying a voltage of 100 mV.

FIG. 8 is a graph showing the oscillation frequency spectrum of the spin torque oscillator according to Comparative Example 3.

FIG. 9 is a graph showing the oscillation frequency spectrum of the spin torque oscillator according to Example 3.

As shown in FIGS. 8 and 9, while the oscillation frequency of the spin torque oscillator of Comparative Example 3 had a peak near 14 GHz, the spin torque oscillator of Example 3 had a peak near 28 GHz, i.e., it was possible to achieve oscillation at a very high frequency.

Next, a mode in which high frequency assisted recording is performed on a magnetic recording medium by using the spin torque oscillator herein explained will be described.

Figure 10:
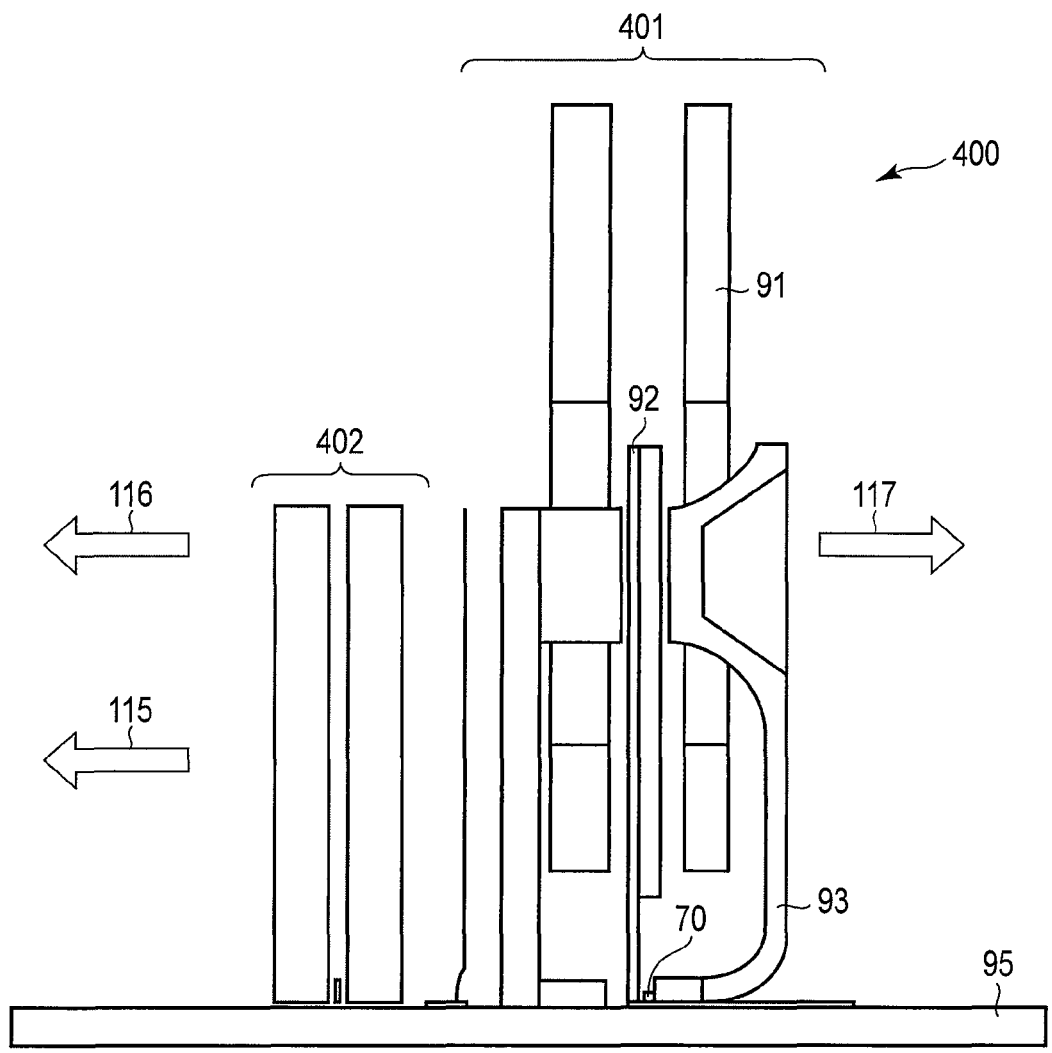
FIG. 10 is a schematic view showing an example of the structure of a magnetic head according to the fourth embodiment.

FIG. 10 is a schematic view showing an example of the structure of the magnetic head according to the fourth embodiment.

A magnetic head 400 is floated close to a magnetic recording medium 95. The magnetic head 400 includes a recording head unit 401 and reproducing head unit 402. The recording head unit 401 includes a recording main magnetic pole 92 whose recording magnetic field is excited by a magnetic coil 91, a trailing shield 93, and a spin torque oscillator 70 placed in the periphery of the gap between these recording magnetic poles. The arrangement of the spin torque oscillator 70 is the same as that shown in FIG. 7. When an electric current is supplied from the recording main magnetic pole 92 to the trailing shield 93 in the magnetic head 400, the recording main magnetic pole 92 can also function as the electrode 701a of the spin torque oscillator, and the trailing shield 93 can also function as the electrode 701b of the spin torque oscillator. Note that in FIG. 10, arrows 115, 116, and 117 respectively indicate the head running direction, reading direction, and trailing direction.

A mode in which high frequency assisted recording is performed on the magnetic recording medium 95 by using the spin torque oscillator 70 will be explained below. In an ordinary magnetic recording head, a recording magnetic field is generated from the recording main magnetic pole 92 to the magnetic recording medium by supplying an excitation electric current to the magnetic coil 91. In the high frequency assisted recording magnetic head 400 according to the embodiment, however, a direct current is applied from the recording magnetic pole 92 to the spin torque oscillator 70 and trailing shield 93, in addition to current excitation to the magnetic coil 91. A high frequency magnetic field having a frequency of a few ten GHz excited from the spin torque oscillator 70 by this current application evokes precession of medium magnetization. Consequently, even a relatively weak recording magnetic field implements medium magnetization reversal recording.

A ferromagnetic material containing a CoPtCr alloy generally used in a magnetic recording medium has a high anisotropic magnetic field of Hk=15 kOe or more, and has a magnetic resonance frequency of 22 GHz or more. As a high frequency magnetic field frequency applied from a spin torque oscillator to a medium becomes closer to this medium magnetic resonance frequency, the magnetization reversal efficiency becomes higher. Accordingly, it is obvious that the spin torque oscillator according to Example 3 is more suitable for high frequency assisted recording than the spin torque oscillator of Comparative Example 3 from the viewpoint of the frequency.

Figure 11:
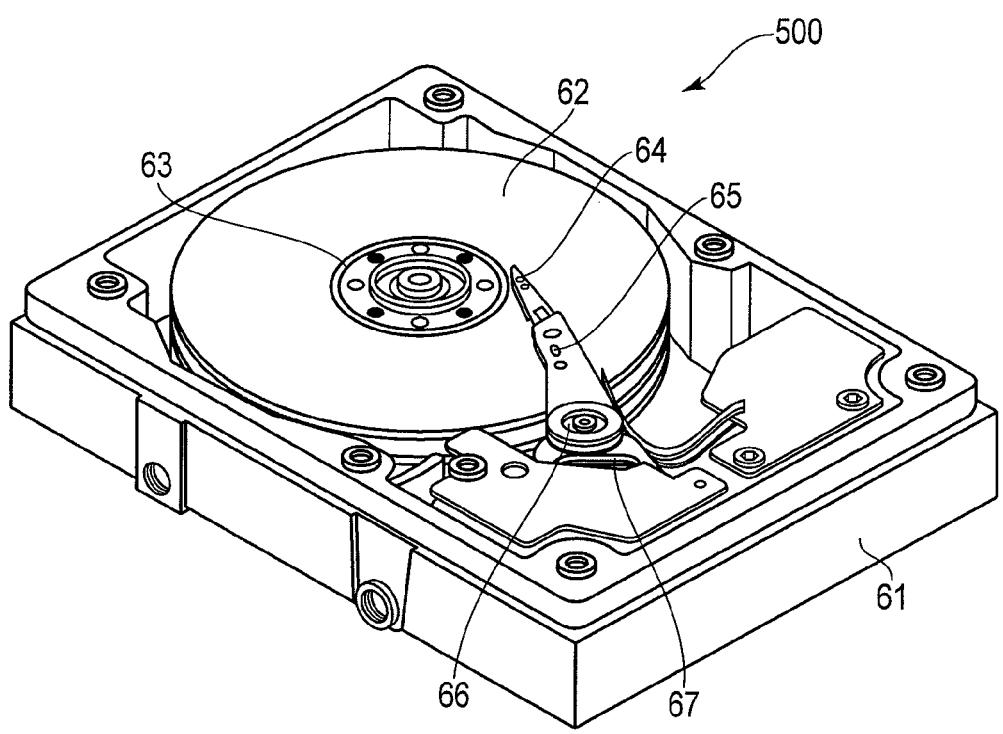
FIG. 11 is a partially exploded perspective view showing an example of a magnetic recording/reproducing apparatus according to the fifth embodiment.

FIG. 11 is a partially exploded perspective view showing an example of the magnetic recording/reproducing apparatus according to the fifth embodiment.

This magnetic recording/reproducing apparatus according to the fifth embodiment includes the above-described magnetic head according to the fourth embodiment.

In a magnetic recording/reproducing apparatus 500 according to the embodiment, a rigid magnetic disk 62 for recording information according to the embodiment is fitted on a spindle 63, and rotated at a predetermined rotational speed by a spindle motor (not shown). A slider 64 on which the magnetic head according to the fourth embodiment which accesses the magnetic disk 62 and records and reproduces information is mounted is attached to the distal end of a suspension 65 made of a thin leaf spring. The suspension 65 is connected to one end of an arm 66 including a bobbin for holding a driving coil (not shown).

A voice coil motor 67 as a kind of a linear motor is formed at the other end of the arm 66. The voice coil motor 67 includes the driving coil (not shown) wound on the bobbin of the arm 66, and a magnetic circuit including a permanent magnetic and counter yoke facing each other so as to sandwich the driving coil between them.

The arm 66 is held by ball bearings (not shown) formed in upper and lower portions of a fixed shaft, and swung by the voice coil motor 67. That is, the voice coil motor 67 controls the position of the slider 64 on the magnetic disk 62. Note that reference numeral 61 in FIG. 11 denotes a housing.

Another application example using the thin magnetic film having a strong negative magnetic anisotropy according to the first embodiment will be explained below.

As the magnetic recording medium according to the sixth embodiment, an example in which this thin magnetic film having a strong negative magnetic anisotropy is used as a soft magnetic backing layer of the magnetic recording medium will be described below.

Example 4

FIG. 12 is a schematic view showing an example of the arrangement of the magnetic recording medium using the thin magnetic film having a strong negative magnetic anisotropy according to the sixth embodiment.

At least one seed layer 103 made of a metal or metal compound, a ruthenium underlayer 102 for controlling the orientation of an immediately overlying layer, and a Co80% Ir20% alloy layer 101 were sequentially deposited on a glass or aluminum substrate 21 by sputtering, and a perpendicular magnetic recording layer 31 made of a CoPtCr-based alloy was directly formed on the layer 101, thereby obtaining a magnetic recording medium. That is, 5-nm thick Pt was deposited as the metal seed layer 103, 20-nm thick Ru was deposited as the underlayer 102, a 20-nm thick CoIr alloy layer 101 was deposited after the substrate temperature was raised to 600° C. after the underlayer 102 was deposited, and a 15-nm thick CoPtCr—SiO$_2$ layer was deposited as the perpendicular magnetic recording layer 101. Since the CoIr alloy layer had a strong negative magnetic anisotropy as indicated in Example 1, magnetization rotated in the in-plane direction with respect to the film surface, so the CoIr alloy layer could function as a soft magnetic backing layer for returning a recording magnetic field from a magnetic recording head.

Also, the CoIr alloy layer had the same hcp structure as that of the Ru underlayer or CoPtCr alloy. Accordingly, it was possible to maintain good magnetic characteristics by directly forming the perpendicular magnetic recording layer 31 mainly containing CoPtCr without forming any Ru underlayer on the CoIr layer. In Example 4, therefore, it was possible to reduce the distance from the medium surface to the soft magnetic backing layer by the film thicknesses of the metal seed layer 103 and Ru underlayer 102, when compared to Comparative Example 4.

The magnetic recording medium of each of Example 4 and Comparative Example 4 was used as the magnetic disk 62, and a magnetic head having a general arrangement in which a simple air gap was formed by removing the spin torque oscillator 70 shown in FIG. 10 was used instead of the magnetic head according to the fourth embodiment. These magnetic disk and magnetic head were incorporated into the magnetic recording apparatus shown in FIG. 11, and comparison was performed using the same magnetic head 53. Consequently, in Comparative Example 4, information recording and reproducing were possible until the coercive force of the perpendicular magnetic recording layer was up to 5.0 kOe, but no information recording was possible when using perpendicular magnetic recording layers having higher coercive forces. On the other hand, when applying Example 4, it was possible to stably record and reproduce information even when using a perpendicular magnetic recording layer having a coercive force of 5.6 kOe. This made it possible to implement a magnetic recording/reproducing apparatus capable of holding stable information for long time periods.

As the recording/reproducing characteristic, the S/N ratio (the ratio of the solitary wave read output to the read noise of AC erase) of a recording/reproducing signal was measured. As a consequence, the S/N ratio was 20.5 dB in Comparative Example 4 when combining the medium having a coercive force of 5.0 kOe, whereas the S/N ratio was 23 dB in Example 4 when combining the medium having a coercive force of 5.6 kOe, i.e., a favorable result was obtained.

As the perpendicular magnetic recording layer, CoPtCr—TaO$_x$ or the like can also be used instead of CoPtCr—SiO$_2$.

Comparative Example 4

A magnetic recording medium was obtained by sequentially forming, by sputtering, a 20-nm thick soft magnetic backing layer made of a CoZrNb-based alloy amorphous soft magnetic material on a glass or aluminum substrate, a 5-nm thick metal seed layer made of an NiTa alloy or NiCr alloy on the soft magnetic backing layer, a 20-nm thick underlayer mainly containing Ru on the metal seed layer, a 15-nm thick perpendicular magnetic recording layer mainly containing CoPtCr on the Ru underlayer, and a 2-nm thick protective film 24 made of carbon on the surface of the perpendicular magnetic recording layer.

The soft magnetic backing layer having an easy axis in the disk in-plane direction returns a recording magnetic field from a magnetic head for magnetizing the perpendicular magnetic recording layer, i.e., has a part of the magnetic head function.

The efficiency of a recording magnetic flux increases as the distance from the protective layer on the surface of the magnetic recording medium to the soft magnetic backing layer shortens. However, maintaining hcp-oriented growth from the underlayer is effective to achieve favorable magnetic characteristics in the CoPtCr-based perpendicular magnetic recording layer. To achieve good magnetic characteristics, therefore, the Ru underlayer having a thickness of 10 nm or more must be formed between the CoPtCr-based perpendicular magnetic recording layer and soft magnetic backing layer.

The film thickness of this underlayer limits the reduction in distance from the medium surface to the soft magnetic backing layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A thin magnetic film comprising:
 a nonmagnetic substrate;
 a ruthenium underlayer formed on the nonmagnetic substrate; and
 a magnetic layer formed in contact with the ruthenium underlayer, having a negative anisotropy of $-6\times10^6$ to $-1.2\times10^7$ erg/cm$^3$ ($-6\times10^8$ to $-1.2\times10^9$ nJ/cm$^3$) in a normal line direction perpendicular to a surface of the magnetic layer, and mainly containing $Co_{1-x}Ir_x$ (x=10 to 45 at %).

2. The film according to claim 1, wherein the ruthenium underlayer is annealed at a temperature of 400° C. (inclusive) to 650° C. (exclusive).

3. The film according to claim 1, further comprising, between the nonmagnetic substrate and the ruthenium underlayer, a seed layer made of at least one material selected from the group consisting of tantalum, platinum, titanium, and nickel.

4. A thin magnetic film manufacturing method comprising:
 forming a ruthenium underlayer on a nonmagnetic substrate;
 annealing the ruthenium underlayer at a temperature of 400° C. (inclusive) to 650° C. (exclusive); and
 forming a magnetic layer mainly containing $Co_{1-x}Ir_x$ (x=10 to 45 at %), in contact with the annealed ruthenium underlayer.

5. The method according to claim 4, further comprising, before the forming the ruthenium underlayer on the nonmagnetic substrate, forming a seed layer made of at least one material selected from the group consisting of tantalum, platinum, titanium, and nickel.

6. A high frequency oscillator comprising:
 a first electrode;
 a ruthenium underlayer formed on the first electrode;
 a first magnetic layer formed in contact with the ruthenium underlayer, having a negative anisotropy of $-6\times10^6$ to $-1.2\times10^7$ erg/cm$^3$ ($-6\times10^8$ to $-1.2\times10^9$ nJ/cm$^3$) in a normal line direction perpendicular to a surface of the first magnetic layer, and mainly containing $Co_{1-x}Ir_x$ (x=10 to 45 at %);
 a nonmagnetic interlayer formed on the first magnetic layer;
 a second magnetic layer formed on the nonmagnetic interlayer, having perpendicular magnetic anisotropy, and containing at least one magnetic material selected from the group consisting of iron, cobalt, and nickel; and
 a second electrode formed on the second magnetic layer.

7. The oscillator according to claim 6, wherein the ruthenium underlayer is annealed at a temperature of 400° C. (inclusive) to 650° C. (exclusive).

8. The oscillator according to claim 6, further comprising, between the nonmagnetic substrate and the ruthenium underlayer, a seed layer made of at least one material selected from the group consisting of tantalum, platinum, titanium, and nickel.

9. A magnetic head comprising:
 a main magnetic pole;
 a recording magnetic pole forming a magnetic circuit together with the main magnetic pole; and
 a high frequency oscillator formed between the main magnetic pole and the recording magnetic pole and comprising
 a first electrode,
 a ruthenium underlayer formed on the first electrode,
 a first magnetic layer formed in contact with the ruthenium underlayer, having a negative anisotropy of $-6\times10^6$ to $-1.2\times10^7$ erg/cm$^3$ ($-6\times10^8$ to $-1.2\times10^9$ nJ/cm$^3$) in a normal line direction perpendicular to a surface of the first magnetic layer, and mainly containing $Co_{1-x}Ir_x$ (x=10 to 45 at %),
 a nonmagnetic interlayer formed on the first magnetic layer,
 a second magnetic layer formed on the nonmagnetic interlayer, having perpendicular magnetic anisotropy, and containing at least one magnetic material selected from the group consisting of iron, cobalt, and nickel, and
 a second electrode formed on the second magnetic layer.

10. A magnetic recording/reproducing apparatus including a magnetic head comprising:
 a main magnetic pole;
 a recording magnetic pole forming a magnetic circuit together with the main magnetic pole; and
 a high frequency oscillator formed between the main magnetic pole and the recording magnetic pole and comprising
 a first electrode,
 a ruthenium underlayer formed on the first electrode,
 a first magnetic layer formed in contact with the ruthenium underlayer, having a negative anisotropy of $-6\times10^6$ to $-1.2\times10^7$ erg/cm$^3$ ($-6\times10^8$ to $-1.2\times10^9$ nJ/cm$^3$) in a normal line direction perpendicular to a surface of the first magnetic layer, and mainly containing $Co_{1-x}Ir_x$ (x=10 to 45 at %),
 a nonmagnetic interlayer formed on the first magnetic layer,
 a second magnetic layer formed on the nonmagnetic interlayer, having perpendicular magnetic anisotropy, and containing at least one type of a magnetic material selected from the group consisting of iron, cobalt, and nickel, and
 a second electrode formed on the second magnetic layer.

11. A perpendicular magnetic recording medium comprising:
 a nonmagnetic substrate;
 a ruthenium underlayer formed on the nonmagnetic substrate;
 a soft magnetic backing layer formed in contact with the ruthenium underlayer, having a negative anisotropy of $-6\times10^6$ to $-1.2\times10^7$ erg/cm$^3$ ($-6\times10^8$ to $-1.2\times10^9$ nJ/cm$^3$) in a normal line direction perpendicular to a surface of the soft magnetic backing layer and mainly containing $Co_{1-x}Ir_x$ (x=10 to 45 at %); and
 a perpendicular magnetic recording layer formed on the soft magnetic backing layer and containing cobalt, chromium, and platinum.

12. The medium according to claim 11, wherein the ruthenium underlayer is annealed at a temperature of 400° C. (inclusive) to 650° C. (exclusive).

13. The medium according to claim 11, further comprising, between the nonmagnetic substrate and the ruthenium underlayer, a seed layer made of at least one type of a material selected from the group consisting of tantalum, platinum, titanium, and nickel.

14. A magnetic recording/reproducing apparatus comprising:
- a perpendicular magnetic recording medium comprising
- a nonmagnetic substrate,
- a ruthenium underlayer formed on the nonmagnetic substrate,
- a soft magnetic backing layer formed in contact with the ruthenium underlayer, having a negative anisotropy of $-6\times10^6$ to $-1.2\times10^7$ erg/cm$^3$ ($-6\times10^8$ to $-1.2\times10^9$ nJ/cm$^3$) in a normal line direction perpendicular to a surface of the soft magnetic backing layer, and mainly containing $Co_{1-x}Ir_x$ (x=10 to 45 at %), and
- a perpendicular magnetic recording layer formed on the soft magnetic backing layer and containing cobalt, chromium, and platinum; and
- a magnetic head.

* * * * *